United States Patent [19]

Bailey et al.

[11] Patent Number: 5,526,951
[45] Date of Patent: Jun. 18, 1996

[54] FABRICATION METHOD FOR DIGITAL MICRO-MIRROR DEVICES USING LOW TEMPERATURE CVD

[75] Inventors: Wayne E. Bailey, Garland; James C. Baker, Coppell, both of Tex.

[73] Assignee: Texas Instruments Incorporated, Dallas, Tex.

[21] Appl. No.: 316,307

[22] Filed: Sep. 30, 1994

[51] Int. Cl.⁶ .................................................. C23C 16/12
[52] U.S. Cl. .............................. 216/24; 216/39; 430/321; 427/162
[58] Field of Search ............... 156/644.1; 216/24, 216/39; 430/321, 320; 437/228, 245; 427/162

[56] References Cited

U.S. PATENT DOCUMENTS

| | | | |
|---|---|---|---|
| 4,956,610 | 9/1990 | Galm et al. | 324/425 |
| 5,083,857 | 1/1992 | Hornbeck | 359/291 |
| 5,149,673 | 9/1992 | MacDonald et al. | 437/192 |

*Primary Examiner*—Charles L. Bowers, Jr.
*Assistant Examiner*—John A. McPherson
*Attorney, Agent, or Firm*—Julie L. Reed; James C. Kesterson; Richard L. Donaldson

[57] ABSTRACT

An improved support post (16, 23) for micro-mechanical devices (10). A conductive layer (33, 71) is deposited on a substrate at all places where the support posts (16, 23) are to be located. A spacer layer (41, 81) is then deposited and etched to form vias (41a, 81a). Each via (41a, 81a) defines the outer surface of a support post (16, 23). The bottom surface of each via is at the conductive layer (33, 71). This permits an aluminum CVD process to selectively fill the vias (41a, 81a), thereby forming the support posts (16, 23).

19 Claims, 6 Drawing Sheets

5,526,951

FABRICATION METHOD FOR DIGITAL MICRO-MIRROR DEVICES USING LOW TEMPERATURE CVD

TECHNICAL FIELD OF THE INVENTION

This invention relates to micro-mechanical devices, and more particularly, to digital micro-mirror devices and a method of fabricating them using chemical vapor deposition.

BACKGROUND OF THE INVENTION

A recent development in the field of electro-mechanics has been the miniaturization of various mechanical devices. Typical of such devices are tiny gears, levers, and valves. These "micro-mechanical" devices are manufactured using integrated circuit techniques, often together with electrical control circuitry. Common applications include accelerometers, pressure sensors, and actuators. As another example, spatial light modulators can be configured from micro-mechanical pixels.

One type of micro-mechanical spatial light modulator is a digital micro-mirror device (DMD), sometimes referred to as a deformable mirror device. The DMD has an array of hundreds or thousands of tiny tilting mirrors. Light incident on the DMD is selectively reflected or not reflected from each mirror to an image plane, to form images. To permit the mirrors to tilt, each is attached to one or more hinges mounted on support posts, and spaced by means of an air gap over underlying control circuitry. The control circuitry provides electrostatic forces, which cause each mirror to selectively tilt.

DMDs have various designs, most of which include the fabrication of support posts to which the hinges are attached. Fabrication of the support posts has been accomplished with two basic approaches. A first approach is to etch vias in a layer of spacer material. Metal is then deposited into the vias to coat each via's inner surface and thereby to form a hollow support post in each via. A second approach is to selectively etch a spacer material so that the remaining material forms solid support posts.

SUMMARY OF THE INVENTION

One aspect of the invention is an improved method of fabricating a support post for a micro-mechanical device. A conductive layer is deposited on a substrate. A spacer layer is deposited over the conductive layer, and vias are etched into the spacer layer. These vias are used as "molds", each via defining the outer surface of a support post. The etch is performed all the way through the spacer layer such that the conductive layer is the bottom surface of each via. Then, the top surface of the spacer layer is exposed to an aluminum chemical vapor deposition (CVD) process. The exposure continues until the vias are filled with aluminum to a desired height. The CVD deposition is selective, in that because of the conductive layer at the bottom of each via, the aluminum is deposited only in the vias and not on the surface of the spacer layer. The spacer layer can then be used as a planar surface upon which to fabricate other elements, and is eventually removed.

An advantage of the invention is that it provides mirror elements whose entire top surface is reflective. As a result, the DMD is more efficient in terms of light usage. The deposition of the support post metal is by means of chemical vapor deposition (CVD), which is a low temperature process that can be performed with photoresist present on the substrate. Also, the CVD is selective to the previously applied conductive layer and avoids the need for etching the CVD material after the CVD deposition.

DETAILED DESCRIPTION OF THE INVENTION

For purpose of example, the following description is in terms of a particular type of "digital micro-mirror device" (DMD), sometimes also referred to as a "deformable mirror device". As described in the Background, one application of DMDs is for forming images, where the DMD has an array of deflectable mirrors that selectively reflect light to an image plane. The images formed by the DMD can be used in display systems or for non-impact printing applications. Other applications of DMDs are possible that do not involve image formation, such as optical steering, optical switching, and accelerometers. In some of these applications, such as an accelerometer, the "mirror" need not be reflective and the applied force is due to acceleration rather than being electrostatic. Also, in some applications, the DMD is not necessarily operated in a digital mode, In general, the term "DMD" is used herein to include any type of micro-mechanical device having at least one hinged and deflectable mass that is spaced by an air gap from a substrate, which it contacts in response to an applied force. As explained below, the invention has several aspects, with a common feature being the incorporation of aluminum chemical vapor deposition (CVD) into the fabrication process. By "aluminum CVD" is meant a CVD process in which the deposited material is primarily or entirely aluminum.

Figure 1:
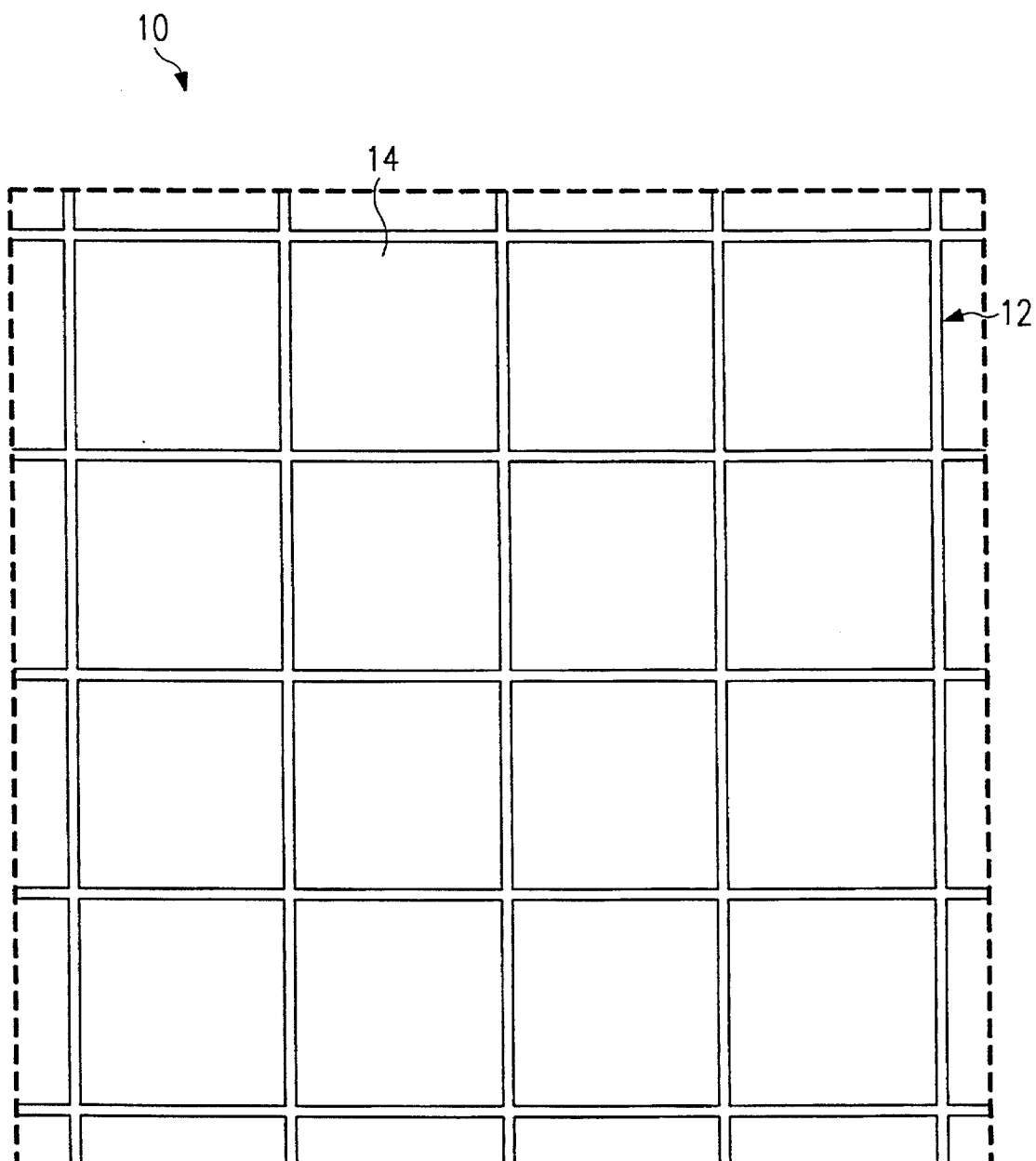
FIGS. 1 and 2 illustrate a hidden-hinge digital micro-mirror device (DMD), made in accordance with the invention.

FIG. 1 is a top plan view of a portion of a DMD 10 having an array of mirror elements 12. In the view of FIG. 1, only the mirror 14 of each mirror element 12 is visible. In a typical DMD 10, the mirror elements 12 are fabricated on 17 micron centers. As explained below in connection with FIG. 10, a feature of the invention is that the support posts under each mirror 14 are hidden due to the nature of the selective CVD process, and the entire surface of each mirror 14 is reflective.

Figure 2:
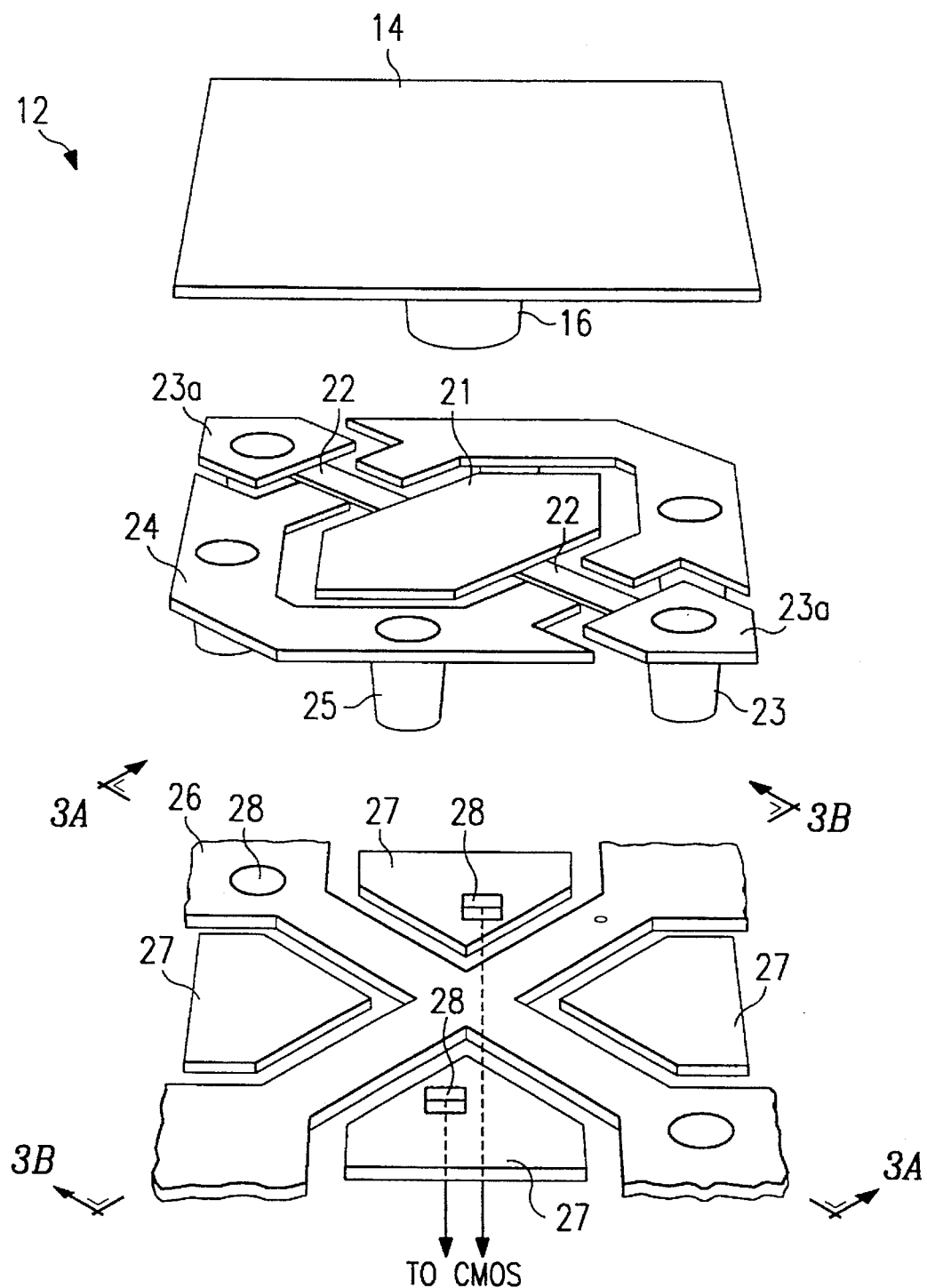

FIG. 2 is an exploded perspective view of a single mirror element 12. For purposes of example, the DMD 10 is a hidden-hinge type DMD. As with other DMD designs, the hinges 22 are supported on support posts 23. Additionally, address electrodes 24 are supported by electrode posts 25 on the same level as hinges 22 and hinge support posts 23. The mirrors 14 are fabricated above the hinge electrode layer and are supported by mirror support posts 16.

Mirror support post 16 is fabricated over a landing yoke 21. Landing yoke 21 is attached to one end of each of the two hinges 22, which are torsion hinges. The other end of each hinge 22 is attached to a hinge support post 23. The hinge support posts 23a and electrode posts 25 support the hinges 22, address electrodes 24, and landing yoke 21 over a control bus 26 and address pads 27. When mirror 14 is tilted, the tip of the landing yoke 21 contacts the control bus 26. The control bus 26 and landing pads 27 have appropriate electrical via contacts 28 with a substrate of address and control circuitry, which is typically fabricated within the substrate using CMOS fabrication techniques.

Thus, each mirror element 12 of a hidden-hinge DMD 10 has three basic structural levels. The contact level includes bus 26 and pads 27. The hinge level includes yoke 21, hinges 22, and address electrodes 24. The mirror level includes mirrors 14.

As explained below in connection with FIGS. 3–11, one aspect of the invention is that mirror support posts 16, hinge support posts 23 and electrode posts 25 are comprised of aluminum that has been deposited with a chemical vapor deposition (CVD) process. Another aspect is that deposition is used to reduce the thickness of metal layers that are patterned and etched. More specifically, the patterning of the metal layers can be accomplished by depositing and etching a thin conductive layer to form the desired elements, and then making the elements thicker by means of selective CVD deposition.

Figure 2A:
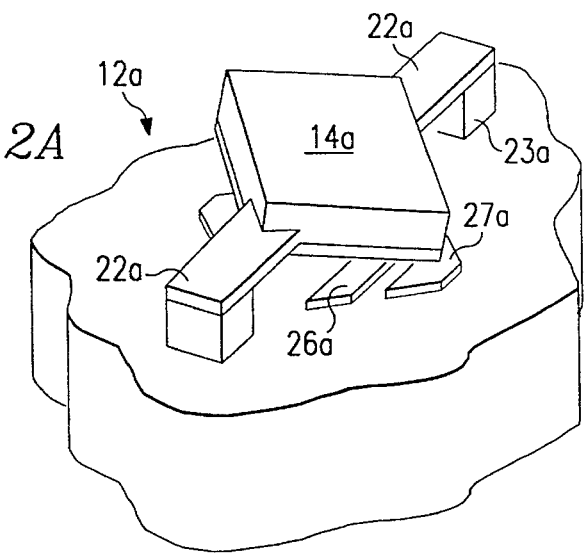
FIG. 2A illustrates a torsion beam DMD, made in accordance with the invention.

FIG. 2A illustrates a mirror element 12a of another type of DMD for which the invention is useful. This is the torsion beam type, whose hinges 22a are not hidden but rather extend from opposing sides of the mirror 14a. In the device of FIG. 2A, hinge support posts 23a would be made in accordance with the invention by filling vias with CVD aluminum and electrodes 26a and 27a could be made by etching a thin layer and adding thickness with CVD aluminum. Other types of DMDs are cantilever beam types and flexure beam types. Various DMD types are described in U.S. Pat. No. 4,662,746, entitled "Spatial Light Modulator and Method"; U.S. Pat. No. 4,956,619, entitled "Spatial Light Modulator"; U.S. Pat. No. 5,061,049 entitled "Spatial Light Modulator and Method"; U.S. Pat. No. 5,083,857 entitled "Multi-level Deformable Mirror Device"; and U.S. patent Ser. No. 08/171,303, entitled "Improved Multi-Level Digital Micromirror Device". Each of these patents is assigned to Texas Instruments Incorporated and each is incorporated herein by reference.

In operation for image display applications, a light source illuminates the surface of the DMD. A lens system may be used to shape the light to approximately the size of the array of mirror elements 10 from FIG. 1 and to direct this light toward them. The mirror support post 16 from FIG. 2 permits mirror 14 to rotate under control of a hinge 22. Mirror 14 rotates in response to an electrostatic force caused by application of an appropriate voltage to an address electrode 24. When mirror 14a from FIG. 2 a rotates, its tip contacts a landing electrode 27a. When mirror 14 from FIG. 2 rotates, yoke 21 contacts bus 26.

Voltages based on data in the memory cells of the underlying CMOS circuit are applied to the two address electrodes 24, which are located under opposing corners of mirror 14. Electrostatic forces between the mirrors 14 and their address electrodes 24 are produced by selective application of voltages to the address electrodes 24. The electrostatic force causes each mirror 14 to tilt either about +10 degrees (on) or about −10 degrees (off), thereby modulating the light incident on the surface of the DMD. Light reflected from the "on" mirrors 14 is directed to an image plane, via display optics. Light from the "off" mirrors 14 is reflected away from the image plane. The resulting pattern forms an image. The proportion of time during each image frame that a mirror 14 is "on" determines shades of grey. Color can be added by means of a color wheel or by a three-DMD setup.

In effect, the mirror 14 and its address electrodes 24 form capacitors. When appropriate voltages are applied to mirror 14 and its address electrodes 24, a resulting electrostatic force (attracting or repelling) causes the mirror 14 to tilt toward the attracting address electrode 24 or away from the repelling address electrode 24. The mirror 14 tilts until yoke 21 contacts bus 26.

Once the electrostatic force between the address electrodes 24 and the mirror 14 is removed, the energy stored in the hinge 22 provides a restoring force to return the mirror 14 to an undeflected position. Appropriate voltages may be applied to the mirror 14 or address electrodes 24 to aid in returning the mirror 14 to its undeflected position.

FIGS. 3–11 illustrate the method aspects of the invention. For purposes of example, the method of the invention is described in terms of fabricating mirror elements 12 of a hidden-hinge DMD 10 of the type described above. Except for the CVD steps, further details of fabricating a DMD of this type are set out in U.S. patent Ser. No. 08/171,303 referred to above. With appropriate modifications, the method could be performed for fabrication of other types of DMDs, or for other types of micro-mechanical devices having support posts.

Figure 3A:
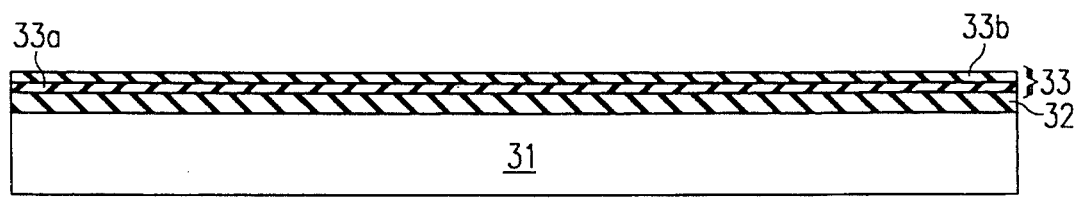
FIGS. 3–11 illustrate the steps of the method of the invention.
Figure 3B:
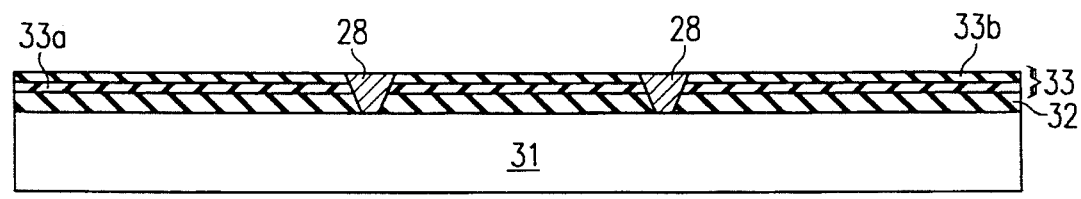

FIGS. 3A and 3B illustrate the contact level of the mirror element 12 of a hidden-hinge DMD 10. Comparing FIGS. 3A and 3B to FIG. 2, FIG. 3A is along line 3A—3A and FIG. 3B is along line 3B—3B and shows contacts 28. The method assumes that the underlying address and control circuitry has been fabricated. This circuitry is shown as CMOS substrate 31. Substrate 31 is covered with a protective oxide layer 32.

One aspect of the invention is the use of selective CVD deposition so that the patterning and etching of control bus 26 and landing address pads 27 may be performed on a thinner layer than with conventional patterning and etching.

First, a thin metal layer 33a is deposited, from which a first layer of control bus 26 and landing address pads 27 are patterned and etched. By "thin" is meant that layer 33a has a thickness relatively less than the desired thickness of control bus 26 and pads 27. Here, where the desired thickness of these elements is approximately 3,000 angstroms, layer 33a has a thickness of approximately 300 angstroms. Thus, "thin" for purposes of layer 33a is in the order of 1/10 the combined thickness of layers 33a and 33b. A suitable material for layer 33a is a titanium-tungsten alloy. After bus 26 and pads 27 are patterned, they are made thicker by CVD deposition of a second metal layer 33b, which is selectively deposited on these patterned elements until they have their desired thickness. The result is a metal layer 33, comprised of etched layer 33a and CVD layer 33b. Alternatively, layer 33 could be deposited as one layer and etched to form control bus 26 and pads 27, as in existing DMD fabrication processes. Regardless of whether control bus 26 and pads 27 are deposited in two steps as layer 33a/33b, or one as layer 33, they provide a conductive surface for subsequent CVD of aluminum, as explained below in connection with FIG. 5.

As shown in FIG. 3B, in appropriate locations, oxide layer 32 has vias to permit contact to metal of CMOS substrate 31. Another aspect of the invention is the use of CVD to deposit aluminum into these vias to form contacts 28. The result is that the contact level is planarized which facilitates fabrication of subsequent layers. This planarization can be formed either before or after bus 26 and pads 27 are patterned.

Figure 4:
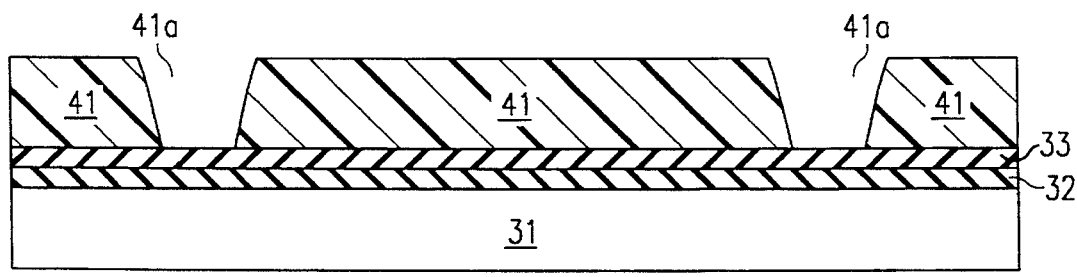

In FIG. 4, a hinge spacer layer 41 has been deposited, yielding a planar surface upon which to fabricate yoke 21 and hinges 22. The thickness of layer 41 determines the size of the air gap under landing yoke 21, which in turn determines the rotation angle of mirror 14. A typical spacer layer 41 is approximately one micron thick. A typical material for spacer layer 41 is photoresist.

As indicated in FIG. 4, spacer layer 41 is patterned and etched to form vias 41a, which define the hinge support posts 23. Typically, vias 41a are round and define substantially cylindrical support posts 23, but other shapes could equivalently be used. The etching of vias 41a is performed to a depth such that the bottom surface of each via 41a is the conductive layer 33.

Figure 5:
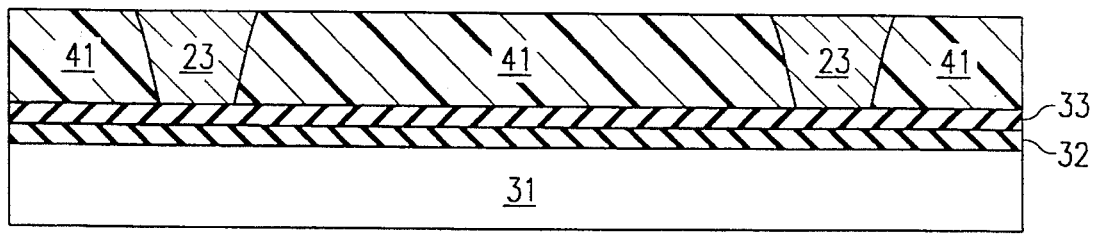

In FIG. 5, the substrate, whose top surface now comprises spacer layer 41 with its vias 41a, is exposed to an aluminum CVD. Layer 33 provides a conductive surface at the bottom of each via 41a, consistent with the selectivity characteristic of CVD. The deposition continues until vias 41a are filled to a desired height, for example, to the top surface of spacer layer 41. Because of the selectivity of the CVD aluminum to the conductive material at the bottom of vias 41a, aluminum is deposited only in vias 41a and not on the surface of spacer layer 41. The result of the deposition of FIG. 5 is the formation of solid support posts 23.

In the view of FIGS. 4 and 5, vias for the address electrode posts 25 are not visible. However, they are formed by etching vias and filling them with aluminum CVD in the same manner and at the same time as the etching and filling steps for posts 23.

Figure 6:
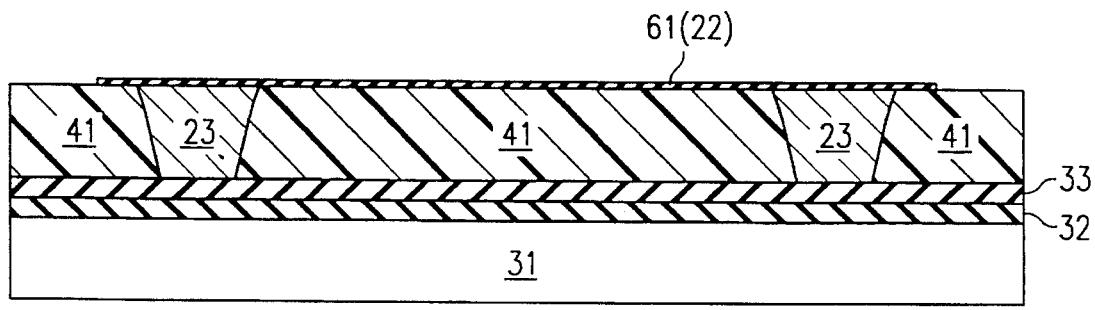

In FIG. 6, a hinge metal layer 61 has been deposited over spacer layer 41 and support posts 23, and patterned and etched to form hinges 22. A range of typical thicknesses of layer 61 is 400–1,000 angstroms. A typical material for layer 61 is an aluminum alloy.

Figure 7A:
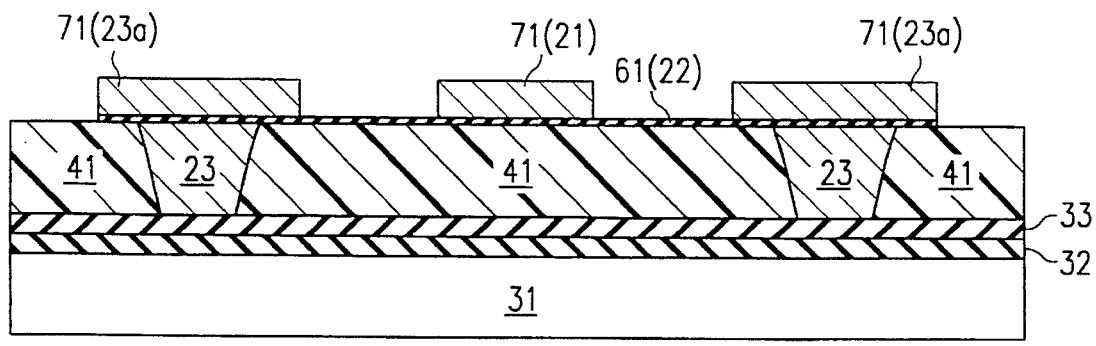

In FIG. 7A, a yoke metal layer 71 has been deposited on the substrate, which now includes the patterned hinges 22. Layer 71 has been patterned and etched to form yokes 21 and a cap 23a on each support post 23. A typical thickness of layer 71 is 3000 angstroms. Like layer 61, a typical material for layer 71 is an aluminum alloy.

Figure 7B:
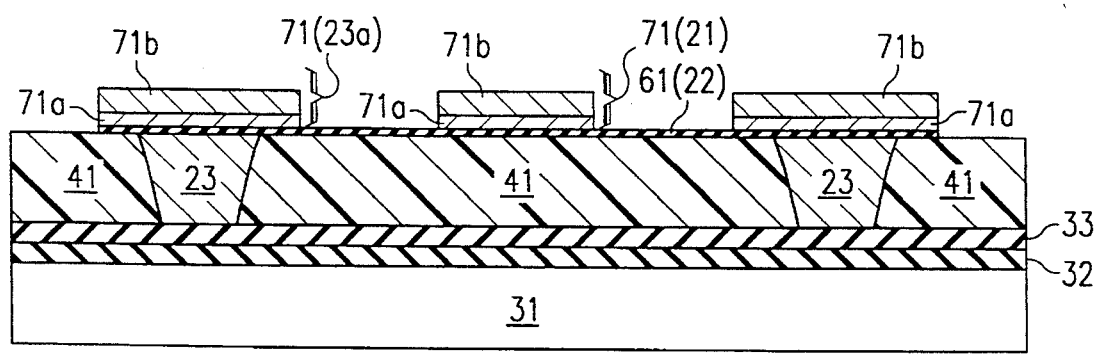

FIG. 7B is an alternative to FIG. 7A, in which yokes 21 and caps 23a are made in two steps in a manner similar to the formation of the contact level in FIG. 3B. First, a conductive layer 71a is deposited and etched. Then, an aluminum CVD is performed to add an additional layer 71b on each yoke 21 and cap 23a until these elements are the desired thickness.

Figure 8:
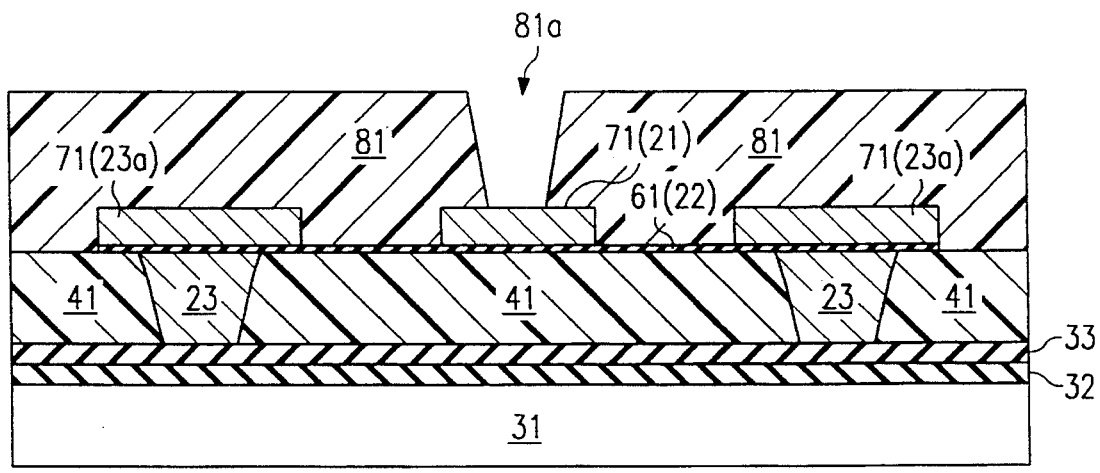

In FIG. 8, a mirror spacer layer 81 has been deposited over the existing substrate. A typical thickness of spacer layer 81 is 2.2 micrometers. It is UV hardened at a temperature of about 180 degrees centigrade. Vias 81a have been etched into the spacer layer 81 to define mirror support posts 16. Like vias 41a, vias 81a have a bottom surface at the conductive layer, here layer 71.

Figure 9:
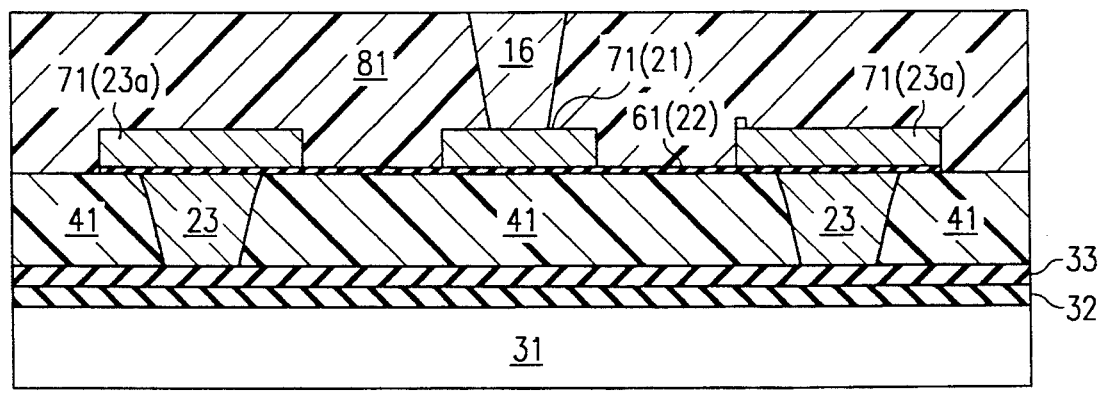

In FIG. 9, aluminum has been deposited into vias 81a with CVD in a manner similar to the CVD deposition of FIG. 5. The metal of layer 71 provides a conductive surface consistent with the selectivity of the CVD. As a result, the aluminum fills vias 81a and forms mirror support posts 16. Because of the CVD selectivity, the aluminum does not cover the surface of spacer layer 81. The CVD continues until the vias 81a are filled to a desired level, for example, to approximately the level of the top surface of spacer layer 81. The result is that support posts 16 are each comprised of a solid piece of aluminum.

Figure 10:
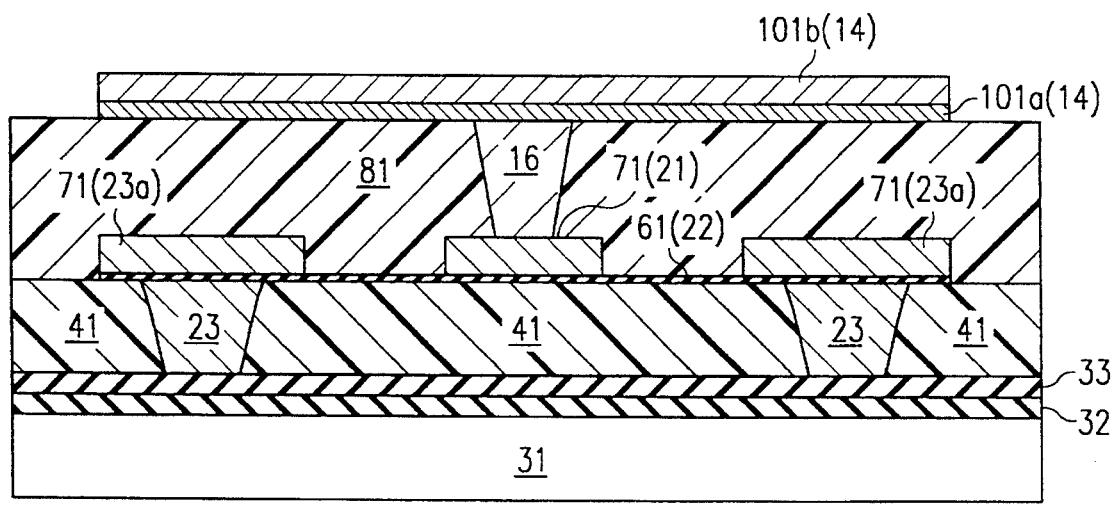

In FIG. 10, a thin layer 101a of a conductive material has been deposited. Layer 101a is approximately 300 angstroms thick, and deposited by conventional means such as sputtering. A typical material for layer 101a is a titanium-tungsten alloy. Layer 101a is etched to form mirrors 14, then layer 101b is deposited by CVD. Because of the CVD, layer 101b is finer grained than with other deposition methods, such as sputtering. The result is improved reflectivity.

As indicated in FIG. 10, because support posts 16 are solid, layers 101a and 101b form a planar surface. The result is a uniform mirror surface contributing to the total reflectivity of mirror 14.

Figure 11:
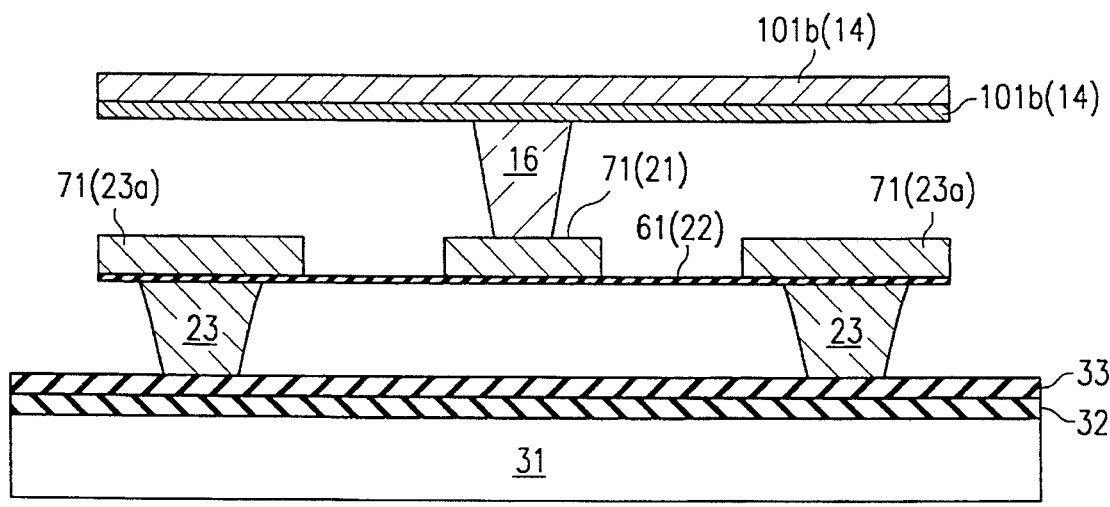

In FIG. 11, the wafer has been sawed into chips. The chips have been placed in a plasma etching chamber, where spacer layers 41 and 81 are removed. This leaves an air gap under mirror 14 and another air gap under yoke 21, to permit them to tilt during operation of the DMD 10.

A feature of the invention is that all CVD steps can be performed at low temperatures. By "low" is meant a temperature that will not significantly degrade previously deposited photoresist. This usually calls for a temperature of less than 400 degrees centigrade.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An improved method of fabricating a support post for a micro-mechanical device having at least one mechanical element supported by said support post, comprising the steps of:

depositing a conductive layer on a substrate;

depositing a spacer layer over said conductive layer;

etching vias into said spacer layer, each via defining an outer surface of a support post, said etching step being performed through said spacer layer such that each said via is bottomed by said conductive layer;

subjecting said spacer layer to an aluminum chemical vapor deposition on its surface; and continuing said subjecting step until said vias are filled with aluminum to a desired height.

2. The method of claim 1, wherein said step of depositing a conductive layer is performed with a material that contains titanium.

3. The method of claim 1, wherein said step of depositing a conductive layer is performed such that said conductive layer is approximately 300 angstroms thick.

4. The method of claim 1, wherein said step of depositing a spacer layer is performed with photoresist.

5. The method of claim 1, wherein said subjecting step is performed at a temperature less than 400 degrees centigrade.

6. An improved method of fabricating a support for digital micro-mirror device, said device having a substrate upon which mirror elements having the following elements are fabricated: a hinge support post, a hinge extending from said hinge support post, a mirror attached to said hinge, wherein said hinge is deformable so as to permit said mirror to deflect upon being subjected to an applied force, comprising the steps of:

depositing a conductive layer on the substrate;

depositing a spacer layer over said conductive layer;

etching vias into said spacer layer, each via defining an outer surface of a hinge support post, said etching step being performed through said spacer layer such that each said via is bottomed by said conductive layer;

subjecting said spacer layer to an aluminum chemical vapor deposition on its surface; and continuing said subjecting step until said vials are filled with aluminum to a desired height.

7. The method of claim 6, wherein said step of depositing a conductive layer is performed with a material that contains titanium.

8. The method of claim 6, wherein said step of depositing a conductive layer is performed such that said conductive layer is approximately 300 angstroms thick.

9. The method of claim 6, wherein said step of depositing a spacer layer is performed with photoresist.

10. The method of claim 6, wherein said subjecting step is performed at a temperature less than 400 degrees centigrade.

11. The method of claim 6, further comprising the step of making the hinge by first depositing a thin conductive hinge layer, patterning and etching said hinge layer, and depositing aluminum by CVD over the patterned hinge layer, until a desired thickness of said hinges is achieved.

12. The method of claim 6, further comprising the step of making the mirrors by first depositing a thin conductive mirror layer, patterning and etching said mirror layer, and depositing aluminum by CVD over the patterned mirror layer, until a desired thickness of said mirrors is achieved.

13. An improved method of fabricating a support post for a digital micro-mirror device, said device having a substrate upon which mirror elements having the following elements are fabricated: a hinge support post, a hinge extending from said support post, a yoke attached to said hinge, a mirror support post on said yoke, and a mirror mounted on said mirror support post, wherein said hinge is deformable so as to permit said mirror to deflect upon being subjected to an applied force, comprising the steps of:

fabricating the hinge support posts by depositing a conductive layer on the substrate; depositing a first spacer layer over said conductive layer; etching vias into said first spacer layer, each via defining an outer surface of a hinge support post, said etching step being performed through said first spacer layer such that each said via is bottomed by said conductive layer; subjecting said first spacer layer to an aluminum chemical vapor deposition on its surface; and continuing said exposing step until said vias are filled with aluminum to a desired height;

fabricating the hinges and the yokes; and fabricating the mirror support posts by depositing a second spacer layer over said yokes; etching vias into said second spacer layer, each via defining the outer surface of a mirror support post, said etching step being performed through said second spacer layer such that said yoke layer is at the bottom of each said via; exposing the top of said second spacer layer to an aluminum chemical vapor deposition; and continuing said exposing step until said vias arc filled with aluminum to a desired height.

14. The method of claim 13, wherein said step of depositing a conductive layer is performed with a material containing titanium.

15. The method of claim 13, wherein said step of depositing a conductive layer is performed such that said conductive layer is approximately 300 angstroms thick.

16. The method of claim 13, wherein said step of depositing a first spacer layer and said step of depositing a second spacer layer are performed with photoresist.

17. The method of claim 13, wherein said subjecting step is performed at a temperature less than 400 degrees centigrade.

18. The method of claim 13, further comprising the step of making the yokes by first depositing a thin conductive yoke layer, patterning and etching said yoke layer, and depositing aluminum by CVD, a desired thickness of said yokes is achieved.

19. The method of claim 13, further comprising the step of making the mirrors by first depositing a thin conductive mirror layer, patterning and etching said mirror layer, and depositing aluminum by CVD, until a desired thickness of said mirrors is achieved.

* * * * *